US008552801B2

(12) United States Patent
Myles (10) Patent No.: US 8,552,801 B2
(45) Date of Patent: Oct. 8, 2013

(54) AMPLIFIER COMMON-MODE CONTROL METHODS

(75) Inventor: Andrew Myles, Edinburgh (GB)

(73) Assignee: Dialog Semiconductor GmbH., Kirchheim/Teck-Nabern (DE)

( * ) Notice: Subject to any disclaimer, the term of this patent is extended or adjusted under 35 U.S.C. 154(b) by 0 days.

(21) Appl. No.: 12/930,757

(22) Filed: Jan. 14, 2011

(65) Prior Publication Data

US 2012/0154048 A1 Jun. 21, 2012

(30) Foreign Application Priority Data

Dec. 17, 2010 (EP) .................................... 10368049

(51) Int. Cl.
*H03F 3/45* (2006.01)

(52) U.S. Cl.
USPC .......................................... 330/258; 330/260

(58) Field of Classification Search
USPC .................................. 330/258, 260
See application file for complete search history.

(56) References Cited

U.S. PATENT DOCUMENTS

| | | | |
|---|---|---|---|
| 5,084,683 A | 1/1992 | Nicollini | |
| RE35,379 E | 11/1996 | Nicollini | |
| 5,936,469 A * | 8/1999 | Alexander et al. | 330/258 |
| 6,380,806 B1 * | 4/2002 | Ang | 330/258 |
| 6,417,728 B1 * | 7/2002 | Baschirotto et al. | 330/9 |
| 6,642,788 B1 * | 11/2003 | Abughazaleh | 330/253 |
| 7,323,935 B2 | 1/2008 | Yang et al. | |
| 7,365,600 B1 | 4/2008 | Lokere | |
| 7,592,867 B2 | 9/2009 | Trifonov et al. | |
| 7,705,671 B1 * | 4/2010 | Bapat et al. | 330/10 |
| 2005/0088228 A1 | 4/2005 | Tai | |
| 2007/0285166 A1 | 12/2007 | Shia et al. | |
| 2008/0315951 A1 | 12/2008 | Rysinski et al. | |

OTHER PUBLICATIONS

European Search Report—10368049.2-1233 Mail date—Jun. 7, 2011, Dialog Semiconductor GmbH.

"A Low-Voltage Fully Balanced OTA with Common Mode Feedforward and Inherent Common Mode Feedback Detector," by Ahmed Nader Mohieldin et al., Solid-State Circuits Conference, 2002, ESSCIRC 2002, 4 pgs., ISBN 978-88-900847-9-9, XP010823864.

"1 V fully balanced differential amplifiers: Implementation and experimental results," by Herve Facpong Achigui et al., Analog Integrated Circuits and Signal Processing, Kluwer Academic Publishers, BO, vol. 53, No. 1, Nov. 11, 2006, pp. 19-25, XP019547917, ISSN: 1573-1979.

Analog Design Essentials, by Willy M. C. Sansen, Copyright 2006 Springer, The Netherlands, pp. 239-290.

(Continued)

*Primary Examiner* — Patricia Nguyen
(74) *Attorney, Agent, or Firm* — Saile Ackerman LLC; Stephen B. Ackerman (57) ABSTRACT

Systems and methods for providing a fully differential amplifier performing common-mode voltage control having reduced area and power requirements are disclosed. The amplifier disclosed comprises an additional input stage at the amplifier input which senses the common mode voltage of the amplifier's inputs and applies internal feedback control to adjust the output common-mode voltage until the input common-mode voltage matches a target voltage and thereby indirectly set the output common-mode voltage. Furthermore the internal common-mode control can be implemented in such a manner as to provide a feed-forward transconductance function in addition to common-mode control if desired. Moreover it is possible to use feedback from other amplifier stages in an amplifier chain to implement common-mode feedback.

20 Claims, 6 Drawing Sheets

(56) References Cited

OTHER PUBLICATIONS

"Design Techniques for Fully Differential Amplifiers," by J. Haspeslagh et al., IEEE 1988 Custom Integrated Circuits Conference, 12.2.1-12.2.4.

"A General Description of Common-Mode Feedback in Fully-Differential Amplifiers," by P.M. Van Peteghem et al., 1990 IEEE, pp. 3209-3212, Downloaded on Jun. 22, 2010 at 15:42:31 UTC from IEEE Xplore.

"Feedback vs feedforward common-mode control: a comparative study," by J.M. Carrillo et al., 1998 IEEE, pp. 363-366, Downloaded on Jun. 22, 2010, at 15:57:44 UTC from IEEE Xplore.

"A Low Voltage Operational Transconductance Amplifier using Common Mode Feedforward for High Frequency Switched Capacitor Circuits," by A. Shankar et al., 2001 IEEE, I-643 to I-646, Downloaded on Jun. 22, 2010 at 15:55:33 UTC from IEEE Xplore.

"A Switched-OPAMP with Fast Common Mode Feedback," by Mikko Waltari et al., 1999 IEEE, pp. 1523-1525, Downloaded on Jun. 22, 2010 at 16:06:37 UTC from IEEE Xplore.

"Common Mode Stability in Fully Differential Voltage Feedback CMOS Amplifiers," by Arturo Tauro et al., 2003 IEEE, pp. 288-291, ICECS-2003, Downloaded on Jun. 22, 2010 at 16:03:31 UTC from IEEE Xplore.

"Continuous-Time Common-Mode Feedback for High-Speed Switched-Capacitor Networks," by David Hernandez-Garduno et al., IEEE Journal of Solid-State Circuits, vol. 40, No. 8, Aug. 2005, pp. 1610-1617.

"A 0.5V Bulk-Input Operational Transconductance Amplifier with Improved Common-Mode Feedback," by Michael Trakimas et al., 2007 IEEE, pp. 2224-2227, Downloaded on Jun. 22, 2010 at 16:02:13 UTC from IEEE Xplore.

"A Power Optimized Continuous-Time Delta-Sigma ADC for Audio Applications," by Shanthi Pavan et al., IEEE Journal of Solid-State Circuits, vol. 43, No. 2, Feb. 2008, pp. 351-360.

"Gain-Enhanced Feedforward Path Compensation Technique for Pole-Zero Cancellation at Heavy Capacitive Loads," by P. K. Chan et al., IEEE Transactions on Circuits and Systems-II: Analog and Digital Signal Processing, vol. 50, No. 12, Dec. 2003, pp. 933-941.

"A Robust Feedforward Compensation Scheme for Multistage Operational Transconductance Amplifiers With No Miller Capacitors," by Bharath Kumar Thandri et al., IEEE Journal of Solid-State Circuits, vol. 38, No. 2, Feb. 2003, pp. 237-243.

* cited by examiner

AMPLIFIER COMMON-MODE CONTROL METHODS

BACKGROUND

(1) Field of the Invention

This invention relates generally to amplifiers and relates more specifically to common-mode control methods.

(2) Description of the Prior Art

Differential circuit implementations are widely used for realizing mixed-signal systems owing to their ability to substantially reject (as common-mode) ambient noise signals e.g. supply noise, reference noise and substrate noise that can ruin signal integrity in single-ended circuit implementations. An issue to address when designing fully differential amplifiers is designing a common-mode voltage control loop to set the differential output common-mode voltage ((see Sansen book reference, chapter 8: "Fully differential amplifiers").

Common-mode control requires methods for both sensing and forcing the differential output voltages' common-mode voltage. Typical requirements for common-mode sensing are:
  sense circuit linearity to avoid common-mode to differential signal conversion (see, e.g., VanPeteghem reference), and
  ability to operate with a wide differential voltage output swing.

These combined requirements are often met using a resistive averaging network to sense the common-mode voltage. Using a low resistance network can reduce the differential open-loop gain via output stage loading, which adversely affect Total Harmonic Distortion (THD), Power Supply Rejection Ratio (PSRR), etc., and can require significant extra power to drive. If buffers are used to minimize gain reduction then power dissipation increases further and differential output swing may be reduced (e.g. through the need to maintain constant gate-source voltage for a source follower buffer). These problems can be mitigated by using a high resistance network, but this may require significant additional silicon area in integrated circuit implementations. There is thus usually a trade-off between power, signal swing, and area when designing conventional common-mode feedback networks for fully differential amplifiers.

Differential amplifiers in chopper stabilized or switched capacitor circuits can often use the system clocks to implement low-power, low area, linear switched capacitor common-mode feedback (See Sansen, Shankar, Waltari and Hernandez-Garduno references for typical examples from the art). However, this is not an option in applications where a clock will not be routed to the amplifier, e.g. because one is not available (the system is continuous-time only) or it is not desired to introduce clocking artefacts into its signal path.

Multi-stage amplifiers can include feed-forward transconductance stages between the inputs and outputs (see Chen and Thandri references and Sansen book chapter 9 for a good overview of multi-stage amplifier compensation) for:
  improved amplifier frequency compensation or
  bandwidth extension by providing a transconductance path that bypasses the main amplifier at frequencies where the main amplifier cannot provide any gain (e.g. in dual path amplifiers), or extra current to drive load capacitances.

Figure 1:
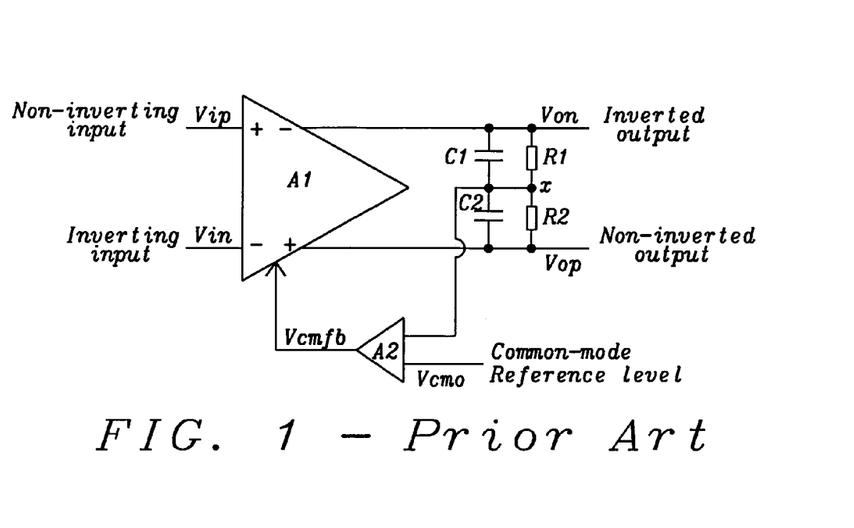
FIG. 1 prior art shows a conventional continuous-time resistive common-mode-feedback (CMFB) arrangement.

FIG. 1 prior art shows a conventional continuous-time resistive common-mode-feedback (CMFB) arrangement.

Differential amplifier A1 requires some method to set the common-mode voltage (quiescent bias voltage) for the differential signals present at its inverted and non-inverted output terminals (nodes "Von" and "Vop" respectively in FIG. 1 prior art). Equal-valued resistors R1 and R2 create a voltage at node X that is the average of A1's differential output voltages:

$$X=(Vop+Von)/2 \qquad (1)$$

Amplifier A2 compares voltage X with a common-mode reference voltage Vcmo and applies a feedback signal vcmfb to amplifier A1 in such a manner as to force voltage X to be controlled by voltage Vcmo (typically X being set equal to Vcmo). Thus the common-mode voltage of nodes Von and Vop is set to Vcmo.

This technique allows a large differential output voltage range (rail-to-rail) for amplifier A1. In comparison, some common-mode control methods use MOSFETs for common-mode sensing (see references), but this approach is usually much less linear and may limit A1's output voltage swing to avoid MOSFET turn-off. However, if resistors R1 and R2 are not to load the outputs of amplifier A1 (reducing the output stage gain) and are not to substantially increase the power dissipated when signal voltages are present at the amplifier outputs then large resistances (i.e. much larger than any load resistances on outputs Von and Vop) are needed. If large resistances are used then often large capacitors C1 and C2 are also required in parallel with R1 and R2 respectively to aid high frequency common-mode control loop stability. These large components can consume considerable silicon area.

Figure 2:
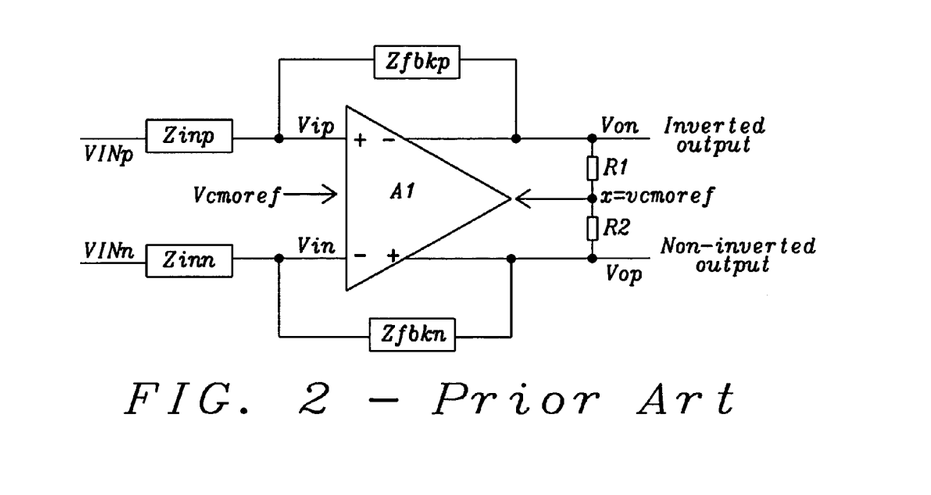
FIG. 2 prior art shows a typical application of a differential amplifier

FIG. 2 prior art shows a typical application of a differential amplifier (see Tauro reference) with internal CMFB details such as amplifier A2 omitted for clarity. In a balanced differential system, input impedances Zinp and Zinn are equal (=Zin), as are feedback impedances Zfbkp and Zfbkn (=Zfbk), giving system differential signal transfer function $$H(j\omega)=-Zfbk(j\omega)/Zin(j\omega) \qquad (2)$$

For resistive impedances, this gives the usual gain transfer function $$\text{Gain}=-Rfbk/Rin$$

It is a challenge for engineers to adapt common-mode control methods to provide a feed-forward transconductance function additional to its common-mode voltage level control function in order to share the circuit implementation power and area overheads between these functions.

There are known patents or patent publications dealing with common-mode control methods.

U.S. Patent Publication (U.S. 2008/0315951 to Rysinski et al.) discloses a differential amplifier includes an output stage, a first common mode feedback circuit; and a current source. The output stage includes first and second complimentary output terminals. The first common mode feedback circuit is operable to determine an average voltage across the first and second complimentary output terminals. The current source is coupled to the output stage, and the common mode feedback circuit is operable to control the current source based on the average voltage. A method includes determining an average voltage across a positive output terminal and a negative output terminal of a differential amplifier output stage and controlling current injected into the output stage based on the average voltage.

U.S. Patent Publication (U.S. 2008/0246543 to Trifonov et al.) discloses a differential amplifier including a differential input pair coupled to a folded cascode stage and a common mode feedback circuit including a tracking circuit coupled to first and second outputs of the folded cascode stage. The first and second outputs are coupled to first terminals of first and second tracking capacitors which have second terminals on which a first common mode output signal is produced and also are coupled to first terminals of third and fourth tracking capacitors, respectively, which have second terminals on which a second common mode output signal is produced. The first and third tracking capacitors are discharged by first and second switches that directly couple the first and second outputs to first and second inputs of a common mode feedback amplifier. A desired common mode output voltage is applied to a third input of the common mode feedback amplifier. The switches are opened to cause the first and second common mode output voltages to be generated, causing a common mode feedback control signal to be generated for biasing the folded cascode stage.

U.S. Patent (U.S. Pat. No. 7,323,935 to Yang et al.) proposes a complementary transconductance amplifier having a common mode feedback circuit including a first-type transconductor, a second-type transconductor and a common mode feedback circuit. The first-type transconductor generates a first differential output signal pair in response to a differential input signal pair under the control of a first control signal. The second-type transconductor generates a second differential output signal pair in response to the differential input signal pair under the control of a second control signal. The common mode feedback circuit generates the second control signal in response to the first and second differential output signal pairs under the control of a common mode control signal.

Furthermore U.S. Patent (U.S. Pat. No. 5,084,683 to Nicollini) describes a filter comprising at least one completely differential operational amplifier having two inputs and two outputs and at least one pair of feedback circuits connecting said outputs with respective inputs of said amplifier outside of same. The operational amplifier has no common-mode feedback circuit, whose functions are performed by said feedback circuits external to the amplifier.

The following literature citations are known in the field of common mode control and operational amplifiers:
1. "Analog Design Essentials" by Willy M. C. Sansen, Springer 2006, ISBN-10 0-387-25746-2
2. "Design techniques for fully differential amplifiers", J. Haspeslagh, W. Sansen, IEEE CICC 1988, pages 12.2.1-12.2.4.
3. "A general description of common-mode feedback in fully-differential amplifiers", P. M. VanPeteghem, J. F. Duque-Carrillo, IEEE ISCAS 1990, pages 3209-3212.
4. "Feedback vs feedforward common-mode control: a comparative study", J. M. Carrillo, J. L. Ausin, P. Merchan, J. F. Duque-Carrillo, IEEE ICECS 1998, pages 363-366.
5. "A low voltage operation transconductance amplifier using common mode feedforward for high frequency switched capacitor circuits", A. Shankar, J. Silva-Martinez, E. Sanchez-Simencio, IEEE ISCAS 2001, pages 643-646.
6. "A switched-opamp with fast common mode feedback", M. Waltari, K. Halonen, IEEE ICECS 1999, pages 1523-1525.
7. "Common-mode stability in fully differential voltage feedback CMOS amplifiers", A. Tauro, C. Marzocca, F. Corsi, A. Di Giandomenico, IEEE ICECS 2003, pages 288-291.
8. "Continuous-time common-mode feedback for high-speed switched-capacitor networks", D. Hernandez-Garduno, J. Silva-Martinez, IEEE JSSC Aug 2005, vol. 40, number 8, pages 1610-1617.
9. "A 0.5 V bulk-input operational transconductance amplifier with improved common-mode feedback", M. Trakimas, S. Sonkusale, IEEE ISCAS 2007, pages 2224-2227.
10. "A power optimized continuous-time Delta-Sigma ADC for audio applications", S. Pavan, N. Krishnapura, R. Pandarinathan, P. Sankar, IEEE JSSC Feb 2008, vol. 43, number 2, pages 351-360.
11. "Gain-enhanced feedforward path compensation technique for pole-zero cancellation at heavy capacitive loads", P. K. Chan, Y. C. Chen, IEEE Trans Ccts & Syst II, Dec 2003, vol. 50, number 12, pages 933-941.
12. "A Robust feedforward compensation scheme for multistage operational transconductance amplifiers with no Miller capacitors", B. K. Thandri, J. Silva-martinez, IEEE JSSC Feb 2003, vol. 38, number 2, pages 237-243.

SUMMARY

A principal object of the present invention is to overcome usual area and/or power trade-offs in designing resistive common-mode control.

A further object of the invention is to save power or area by combining feed-forward transconductance function with common-mode control function.

In accordance with the objects of this invention a method to provide a fully differential amplifier performing common-mode voltage control having reduced area and power requirements has been achieved. The method invented comprising the steps of: (1) providing a fully differential amplifier having a continuous-time signal path feedback network between amplifier's differential inputs and differential outputs, and (2) deploying an additional input stage at the amplifier's input, which senses the common-mode voltage of the amplifier's input, compares the input common-mode voltage with a reference voltage, and regulates depending on the result of the comparison the output common-mode voltage via the existing continuous signal path feedback network without requiring devices additional to the existing signal path network.

In accordance with the objects of this invention a fully differential amplifier having a continuous-time signal path feedback network wherein a differential common-mode outputs voltage Vcmo is controlled indirectly by controlling a differential inputs common-mode voltage Vcm and wherein Vcmo is controlled via Vcm has been achieved. The common-mode output voltage control is performed without requiring devices additional to the signal path feedback network to sense Vcmo directly.

BRIEF DESCRIPTION OF THE DRAWINGS

In the accompanying drawings forming a material part of this description, there is shown.

DESCRIPTION OF THE PREFERRED EMBODIMENTS

Methods and circuits to overcome usual area and/or power trade-offs in designing resistive common-mode control in differential amplifying and filtering circuits are disclosed. The invention can be applied to any amplifying and filtering circuits, which provide a DC feedback connection between circuit's differential outputs and inputs.

Referring to a typical application of a differential amplifier as shown. e.g. in FIG. 2 prior art three common-mode voltages can be identified:

Differential signal inputs common-mode
voltage=Vcmin=(VINp+VINn)/2   (3a)

Differential outputs common-mode voltage=Vcmo=
(Von+Vop)/2   (3b)

Amplifier differential inputs common-mode
voltage=Vcm=(Vip+Vin)/2   (3c)

These are not completely independent voltages. Assuming the amplifier inputs draw negligible current (usually true with FET inputs—but not essential to make the method work), then by potential division:

$Vcm=(Zfbk.Vcmin+Zin.Vcmo)/(Zfbk+Zin)$   (4)

where "." in equation (4) denotes a multiplication operation.

Thus, if two of these voltages can be controlled, then the other is automatically set.

It should be noted that in preferred embodiments of the invention the feedback impedances Zfbk are enabled to allow continuous feedback operation.

A key aspect of this invention is to control Vcmo indirectly by controlling Vcm rather than the usual approach of directly controlling Vcmo. If Vcmin and Vcm are set to identical voltages then it follows that:

$Vcmo=Vcmin=Vcm$   (5)

Note that Vcm is easily sensed by an additional differential stage at the amplifier input. Normal amplifier operation, which forces voltage difference |Vip-Vin| to be small enough that the main differential input stage operates linearly also ensures that the sensing differential stage will be operating linearly. Summarizing, this approach uses the existing feedback network impedances to sense and control Vcmo via Vcm without requiring additional components, as e.g. additional resistors R1 and R2 (and possibly C1 and C2) shown in FIG. 1 prior art to be added to the amplifier output to sense the output common-mode voltage directly.

Figure 3:
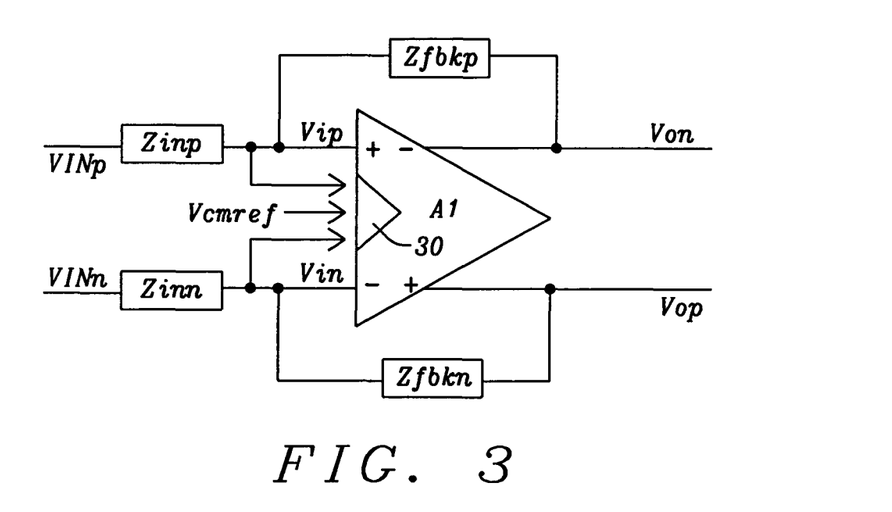
FIG. 3 shows a block diagram of an amplifier configuration wherein an internal common mode feedback loop senses the amplifier input common-mode voltage and attempts to force this voltage to vcmref by driving the amplifier outputs and feedback networks and thereby indirectly sets the common-mode output voltage.

FIG. 3 illustrates the approach of the present invention, namely combining feedback around the amplifier with common-mode control function. FIG. 3 shows an amplifier configuration wherein an additional input stage 30 compares the amplifier input common-mode to Vcmref and drives the outputs Vop and Von such as to force via the feedback network the input common-mode voltage to equal Vcmref. If Vcmref is set equal to the common-mode voltage of inputs VINp and VINn then the common-mode voltages at both the amplifier inputs and outputs will also be Vcmref.

Figure 4A:
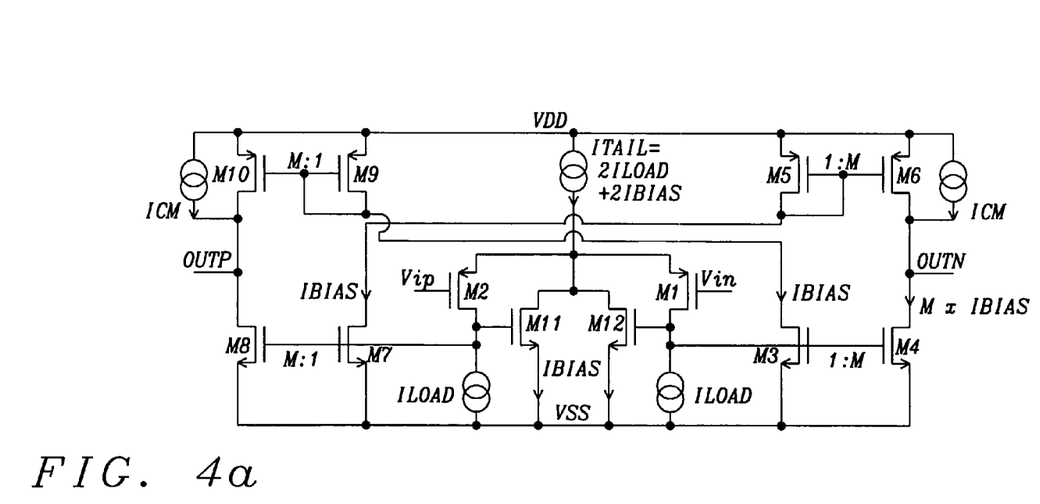
FIG. 4a shows an implementation of a fully differential amplifier suitable to adopt the new common-mode control method.
Figure 4B:
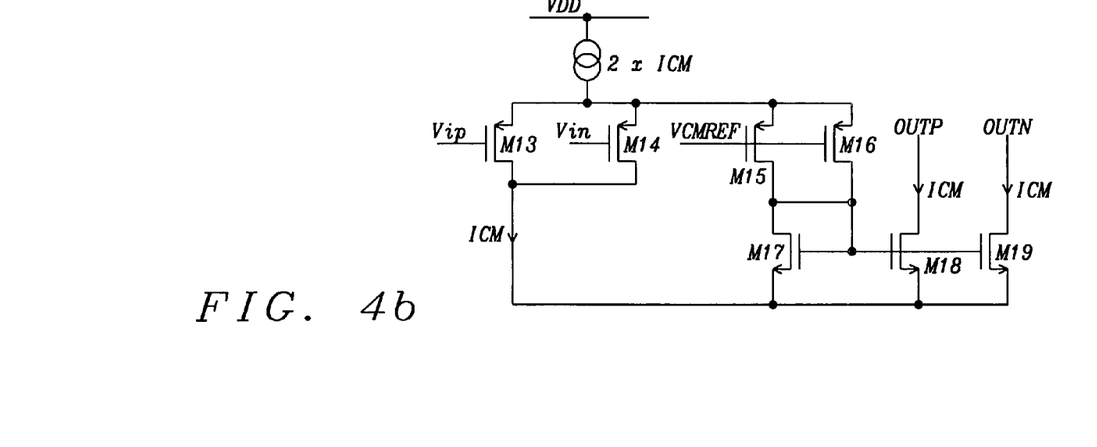
FIG. 4b shows a differential input stage, illustrating one possible implementation of the invented common-mode control method.

FIG. 4a shows one possible implementation of a fully-differential amplifier suitable for use with a continuous-time signal path feedback network. The proposed common-mode control method is implemented without needing devices additional to the existing signal path feedback network (the resistive feedback network devices Rin and Rbfk around the amplifier are not shown). It should be noted that FIGS. 4a and 4b show different parts of the same amplifier. The split of FIGS. 4a and 4b is to highlight the division between "standard" amplifier and the new common-mode circuitry. Furthermore it has to be understood that the circuit of FIG. 4b realizes a general principle of the present invention that can be generally applied to various amplifier designs.

This is a simplified schematic, omitting standard details such as current sources implementation, cascodes (e.g. for improving drain voltage matching for matched transistors), and the frequency compensation networks. This is a class-AB amplifier with differential input stage M1-M2 and class-AB output stages M3-M6 and M7-M10. Transistors M11-M12 are matched to M3, M4, M7, and M8 and set the quiescent output bias current in the class-AB stages.

Output common-mode control is achieved by new, additional differential input stage M13-M16, comprising 4 identical devices, as shown in FIG. 4b. This circuit senses the common-mode voltage, Vcm, at nodes VIP and VIN by averaging these voltages using devices M13 and M14 and compares this to common-mode reference level VCMREF using M15 and M16. If the common-mode voltage (VIP+VIN)/2 exceeds VCMREF then outputs OUTP and OUTN are pulled lower by sinking more current in devices M18-M19. This then pulls input nodes VIP and VIN lower via the amplifier feedback network until Vcm=VCMREF.

Since correct operation of differential pair M1-M2 requires voltage difference |VIP-VIN| is small enough to keep differential pair M1-M2 in its linear operating region, very linear operation of the secondary differential sensing and comparing stage M13-M16 is easy to achieve.

If the amplifier of FIG. 4a is used in a configuration such as shown in FIG. 3, where VCMREF is set equal to the input signal path common mode voltage Vcmin and then the internal common-mode feedback loop CMFB attempts to force all common-mode voltages to VCMREF:

$Vcmin=Vcm=VCMREF=Vcmo$   (6)

thus setting the output common-mode voltage Vcmo without needing devices additional to the existing signal path feedback networks to sense this common-mode voltage. This is an important point of the present invention. If Vcmin does not equal VCMREF then:

$Vcmo=Vcm+(Vcm-Vcmin)Rfbk/Rin$   (7)

Figure 5A:
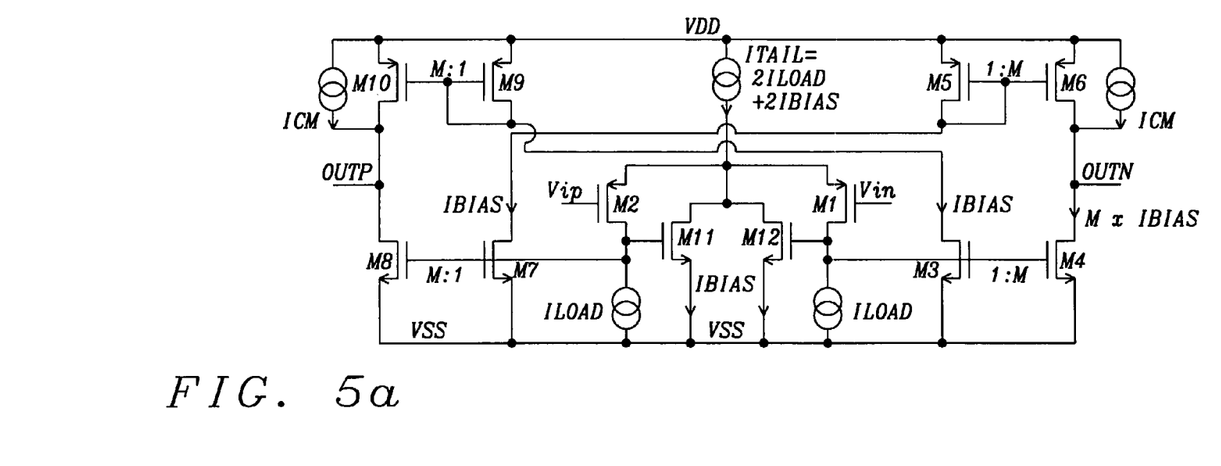
FIG. 5a shows an implementation of a fully differential amplifier suitable to adopt the new common-mode control method.
Figure 5B:
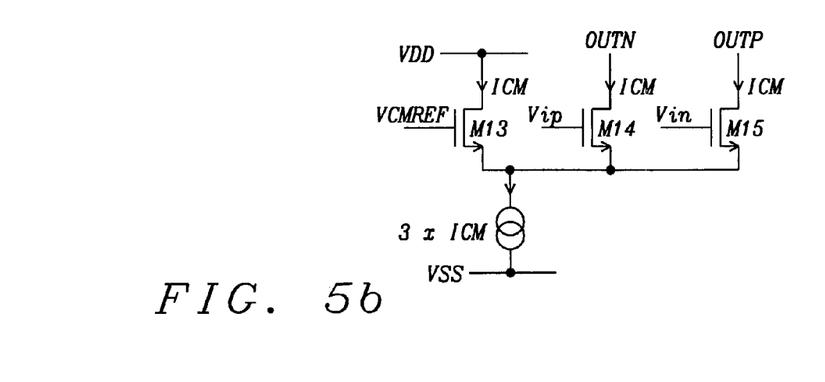
FIG. 5b shows another possible common-mode control implementation for an amplifier where a triple-input differential stage controls the amplifier output common-mode voltage in response to the common-mode level at VIP and VIN.

FIG. 5a shows one possible implementation of a fully-differential amplifier suitable to adopt the invented input stage shown in FIG. 5b. FIG. 5b shows another possible common-mode control implementation for an amplifier where triple-input differential stage M13-M15 controls the amplifier output common-mode voltage in response to the common-mode level at VIP and VIN.

It should be noted that FIGS. 5a and 5b show different parts of the same amplifier. The split of FIGS. 5a and 5b is to highlight the division between a "standard" amplifier and a new common-mode circuitry. Furthermore it has to be understood that the circuit of FIG. 5b realizes a general principle of the present invention that can be generally applied to various amplifier designs.

With no differential signal present (quiescent bias conditions), devices M13-M15 sense and adjust the amplifier common-mode output level in response to the common-mode voltage difference Vcm-VCMREF in a similar manner to the circuits of FIG. 4. Devices M14 and M15 average the voltages VIP and VIN to obtain the input common-mode voltage and compare this with Vcmref using M13. However, when differential small signals are present at VIP and VIN then M14 and M15 can also provide a differential feed-forward current path that can improve the amplifier high-frequency performance by designing current ICM and sizing M14 and M15 to achieve the desired transconductance (the benefits depend on the specific differential amplifier architecture and frequency compensation desired). The sign of the feed-forward transconductance can be changed by swapping the drain connections of M14 and M15. It will be obvious that other circuit configurations could be used to implement feedforward transconductance and common-mode control (e.g. for improved differential output range and common-mode control linearity over the implementation shown in FIG. 5, which was chosen for simplicity and clarity rather than best performance).

Figure 5C:
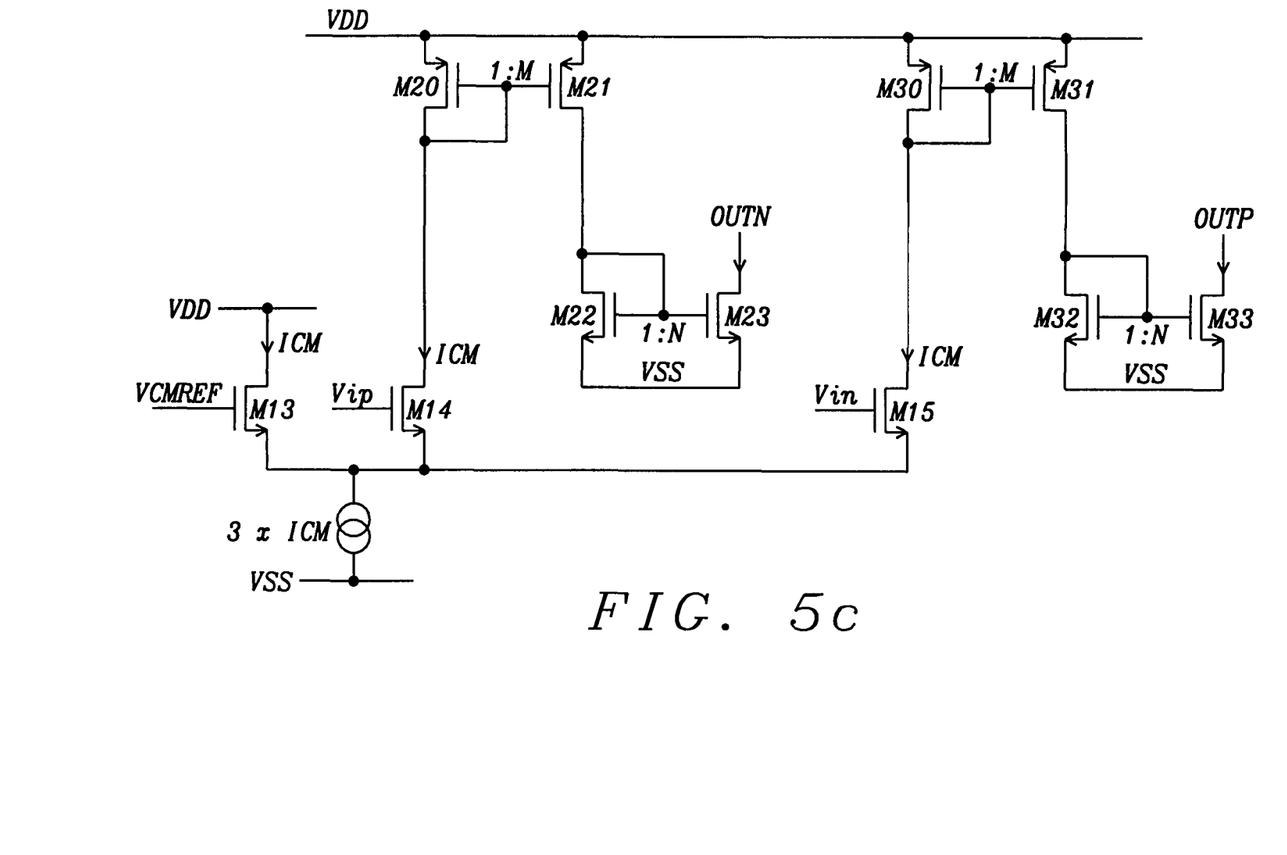
FIG. 5c shows a possible improved embodiment of the circuit shown in FIG. 5b wherein additional current mirrors M20-M21/M22-M23 and M30-M31/M32-M33 provide for increased amplifier output voltage range by permitting OUTN and OUTP to swing to within the drain saturation voltages of M23 and M33 of supply rail VSS.

FIG. 5c shows a possible improved embodiment of the circuit shown in FIG. 5b wherein additional current mirrors M20-M21/M22-M23 and M30-M31/M32-M33 provide for increased amplifier output voltage range by permitting OUTN and OUTP to swing to within the drain saturation voltages of M23 and M33 of supply rail VSS. Implementation of the circuit of FIG. 5c also permits feedforward transconductance boosting by a factor (M.N) by suitable ratioing of the current mirrors M20-M21/M22-M23 and M30-M31/M32-M33 as shown.

The key point here is that using a circuit configuration with gate connections to VIP and VIN in the common-mode control paths instead of using devices with connections to VCMREF (as happens in FIG. 5 via M15 and M16) means that we obtain feed-forward differential transconductance in addition to common-mode biasing control.

Figure 6:
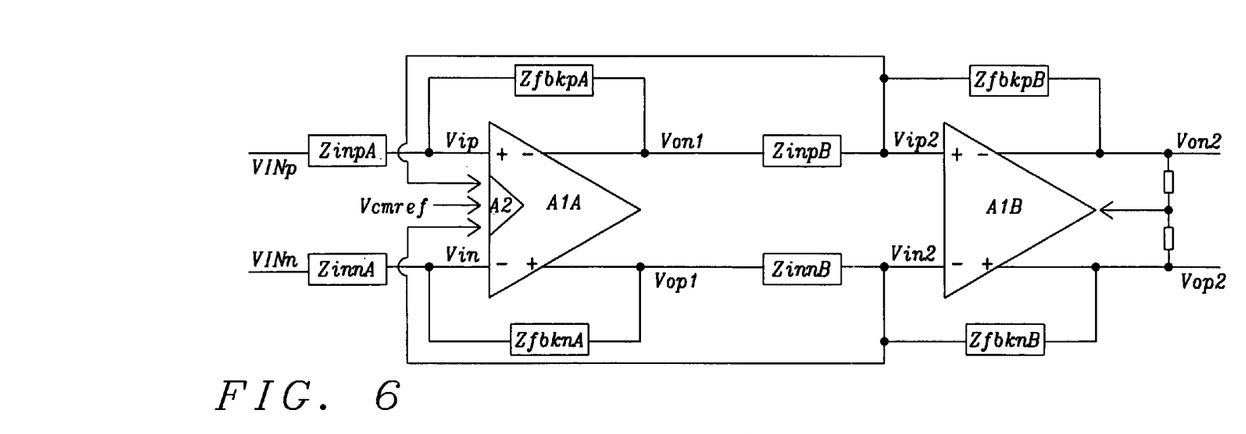
FIG. 6 shows an example where the input resistances of a second amplifier stage sense the common-mode voltage of a first amplifier stage.

There are other obvious variations on the common-mode control principle claimed here that we would also wish to consider. For example, in a chain of amplifier stages, it may be possible to use the feedback network of one stage to sense the output common-mode of the previous stage. FIG. 6 shows one example where the input resistances of amplifier stage A1B sense the common-mode voltage of amplifier A1A (averaged with the common-mode output level of A1B through its feedback network) and this can be fed back to amplifier A1A for control of its common-mode output voltage. This may be advantageous if stage A1A's feedback sets a high dc gain, which will amplify small differences between the common mode voltages at differential voltage nodes VINp/VINn and Vip/Vin (see equation (7)), possibly making accurate control of A1's output common-mode difficult. Other sensing arrangements are clearly possible under the general principle of sensing common-mode voltages using the already-existing feedback networks without adding additional common-mode sensing networks.

Figure 7:
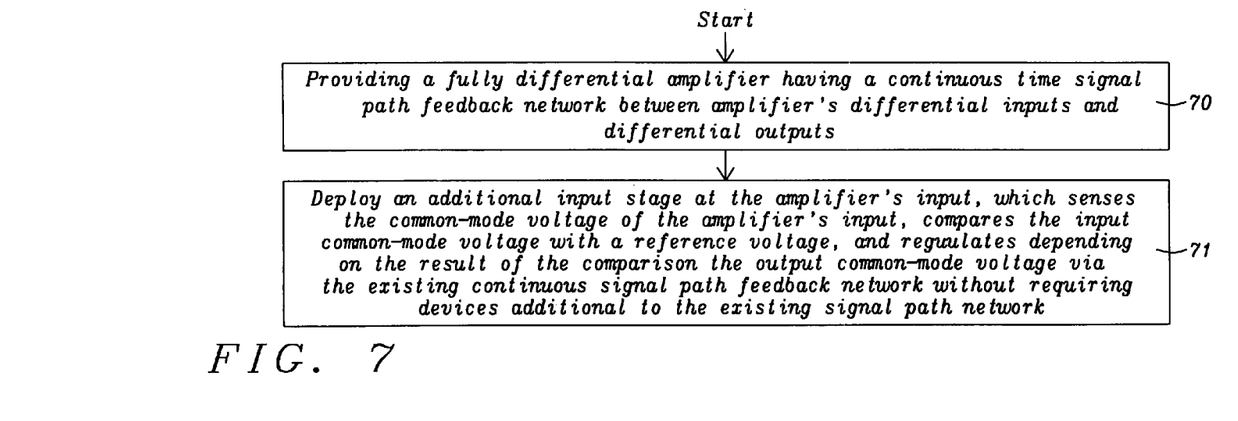
FIG. 7 illustrates a flowchart of a method invented to achieve a fully differential amplifier performing common-mode voltage control having reduced area and power requirements.

FIG. 7 illustrates a flowchart of a method invented to achieve a fully differential amplifier performing common-mode voltage control having reduced area and power requirements.

Step 70 of the method of FIG. 7 illustrates the provision of a fully differential amplifier having a continuous-time signal path feedback network between amplifier's differential inputs and differential outputs. As mentioned above the method invented is also applicable to differential filtering circuits. Step 71 depicts deploying an additional input stage at the amplifier's input, which senses the common-mode voltage of the amplifier's input, compares the input common-mode voltage with a reference voltage, and regulates depending on the result of the comparison the output common-mode voltage via the existing continuous signal path feedback network without requiring devices additional to the existing signal path network.

While the invention has been particularly shown and described with reference to the preferred embodiments thereof, it will be understood by those skilled in the art that various changes in form and details may be made without departing from the spirit and scope of the invention.

What is claimed is:

1. A method to achieve a fully differential amplifier performing common-mode voltage control having reduced area and power requirements, comprising the following steps:
   (1) providing a fully differential amplifier having a continuous-time signal path feedback network between amplifier's differential inputs and differential outputs; and
   (2) deploying an additional input stage at the amplifier's input, which senses the common-mode voltage of the amplifier's input, compares the input common-mode voltage with a reference voltage, and regulates, depending on the result of the comparison, the output common-mode voltage via the existing continuous signal path feedback network without requiring devices additional to the existing signal path network, wherein the common-mode voltage control is implemented in such a manner as to provide a feed-forward transconductance function in addition to the common-mode control.

2. The method of claim 1 wherein said method is also applied to differential filtering circuits.

3. The method of claim 1 wherein the common-mode voltage of the amplifier's input is applied to the internal signal paths to adjust the output common-mode voltage until the input common-mode voltage matches a target voltage and is thereby setting also the output common-mode voltage.

4. The method of claim 1 wherein in a chain of amplifier stages the signal path feedback network of one stage is used to sense the output common voltage of a previous stage.

5. The method of claim 4 wherein in said chain of amplifier stages input resistances of a stage sense the common-mode output voltage of the previous stage, which is averaged with the common-mode output level of the stage through its feedback network, and the common-mode output voltage of the previous stage is fed back to the previous stage for control of its common-mode output voltage.

6. The method of claim 1 wherein amplifier's differential outputs common-mode voltage is indirectly controlled by controlling amplifier's differential inputs common-mode voltage.

7. The method of claim 1 wherein said additional input stage averages the differential input voltages sensed in order to determine the input common-mode voltage, and compares the common-mode voltage of the input nodes with a common-mode reference voltage and, if the common-mode voltage of the input nodes differs compared to the common-mode reference voltage, the common-mode output voltage is regulated correspondently and this controls the common-mode input voltage via the amplifier signal path feedback network until the common-mode voltage is equal to the common-mode reference voltage.

8. The method of claim 1 wherein the additional input stage is a differential triple-input stage controlling the amplifier's output common-mode voltage in response to the common-mode voltage level at the amplifier's input node.

9. The method of claim 8 wherein, if differential small signals are present at the amplifier's input nodes, then the triple-input differential stage provides a differential feed-forward current path that improves the amplifier high frequency performance to obtain feed-forward differential transconductance in addition to common-mode biasing control.

10. A fully differential amplifier having a continuous-time signal path feedback network wherein a differential common-mode outputs voltage Vcmo is controlled indirectly by controlling a differential inputs common-mode voltage Vcm and wherein Vcmo is controlled via Vcm without requiring devices additional to the signal path feedback network to sense Vcmo directly wherein Vcm is easily sensed by an additional differential stage at the amplifier input and wherein the common-mode voltage control is implemented in such a manner as to provide a feed-forward transconductance function in addition to the common-mode control.

11. The amplifier of claim 10 wherein the control of Vcmo is achieved by an additional differential input stage at the amplifier input, wherein the input stage senses the inputs common-mode voltage Vcm at both input nodes of the amplifier by averaging both voltages and comparing the averaged voltage with a common-mode reference voltage Vcmref and, if there is difference between these both voltages, two output nodes of the amplifier are regulated accordingly and the regulation of the output nodes regulates the input nodes accordingly via the feedback network until Vcm equals Vcmref.

12. The amplifier of claim 11 wherein the differential input stage comprises four identical MOS devices achieving a high linearity of its operation, wherein a first and a second MOS device perform said averaging and a third and a fourth MOS device perform said comparing.

13. The amplifier of claim 11 wherein the differential input stage comprises three MOS devices and wherein a second and a third MOS device perform said averaging and a first MOS device perform said comparing.

14. The amplifier of claim 13 wherein, when differential small signals are present at the input nodes of the amplifier then the second and third MOS device can also provide a differential feed-forward current path improving the amplifier's high frequency performance and achieving a transconductance desired.

15. The amplifier of claim 13 wherein by using a circuit configuration of the common-mode voltage control paths with gate connections to the amplifier's input nodes a feed-forward differential transconductance in addition to common-mode biasing control can be achieved.

16. The amplifier of claim 13 wherein additional current mirrors provide for increased amplifier output voltage range of both output nodes.

17. The amplifier of claim 16 wherein for each output node a first and a second current mirror are deployed wherein both first current mirrors have a ratio of 1:M and both second current mirrors have a ration of 1:N, thus boosting feedforward transconductance by factor M.N.

18. The amplifier of claim 10 wherein a chain of amplifier stages is deployed.

19. The amplifier of claim 18 wherein the signal path feedback network of one stage is used to sense the output common voltage of a previous stage.

20. The amplifier of claim 19 wherein in said chain of amplifier stages input resistances of a stage sense the common-mode output voltage of the previous stage, which is averaged with the common-mode output level of the stage through its feedback network, and the common-mode output voltage of the previous stage is fed back to the previous stage for control of its common-mode output voltage.

* * * * *